United States Patent
Arayashiki

(10) Patent No.: US 8,895,948 B2
(45) Date of Patent: Nov. 25, 2014

(54) MEMORY DEVICE

(71) Applicant: Kabushiki Kaisha Toshiba, Minato-ku, Tokyo (JP)

(72) Inventor: Yusuke Arayashiki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/776,458

(22) Filed: Feb. 25, 2013

(65) Prior Publication Data

US 2014/0070156 A1    Mar. 13, 2014

(30) Foreign Application Priority Data

Sep. 11, 2012  (JP) .................................. 2012-199766

(51) Int. Cl.
*H01L 29/02*    (2006.01)
*H01L 45/00*    (2006.01)
*H01L 27/24*    (2006.01)

(52) U.S. Cl.
CPC .............. *H01L 45/14* (2013.01); *H01L 45/146* (2013.01); *H01L 45/145* (2013.01); *H01L 45/085* (2013.01); *H01L 45/148* (2013.01); *H01L 45/165* (2013.01); *H01L 27/2481* (2013.01); *H01L 45/1233* (2013.01); *H01L 45/1658* (2013.01)
USPC ................ 257/2; 257/3; 257/4; 257/E45.001; 438/104; 438/382

(58) Field of Classification Search
CPC . H01L 27/101; H01L 45/1266; H01L 45/145; H01L 45/1233
USPC .......... 257/2–5, E45.002, E45.001, E47.001, 257/E47.005; 438/104, 382
See application file for complete search history.

(56) References Cited

U.S. PATENT DOCUMENTS

| | | |
|---|---|---|
| 2009/0014707 A1 | 1/2009 | Lu et al. |
| 2010/0002491 A1 | 1/2010 | Hwang et al. |
| 2012/0068146 A1 | 3/2012 | Hattori et al. |
| 2012/0069625 A1 | 3/2012 | Wada |
| 2012/0241709 A1* | 9/2012 | Tsuji ................................ 257/2 |

FOREIGN PATENT DOCUMENTS

| | | |
|---|---|---|
| JP | 2006-319263 A | 11/2006 |
| JP | 2009-049322 A | 3/2009 |
| JP | 2009-212380 A | 9/2009 |
| JP | 2010-016381 A | 1/2010 |
| JP | 2012-064808 A | 3/2012 |
| JP | 2012-069602 A | 4/2012 |

* cited by examiner

*Primary Examiner* — Mark A Laurenzi
(74) *Attorney, Agent, or Firm* — Holtz, Holtz, Goodman & Chick PC

(57) ABSTRACT

According to one embodiment, a memory device includes a first electrode, a second electrode and a resistance change film. The resistance change film is connected between the first electrode and the second electrode. An ion metal is introduced in a matrix material in the resistance change film. A concentration of the ion metal in a first region on the first electrode side of the resistance change film is higher than a concentration of the ion metal in a second region on the second electrode side of the resistance change film A layer made of only the ion metal is not provided in the memory device.

13 Claims, 10 Drawing Sheets

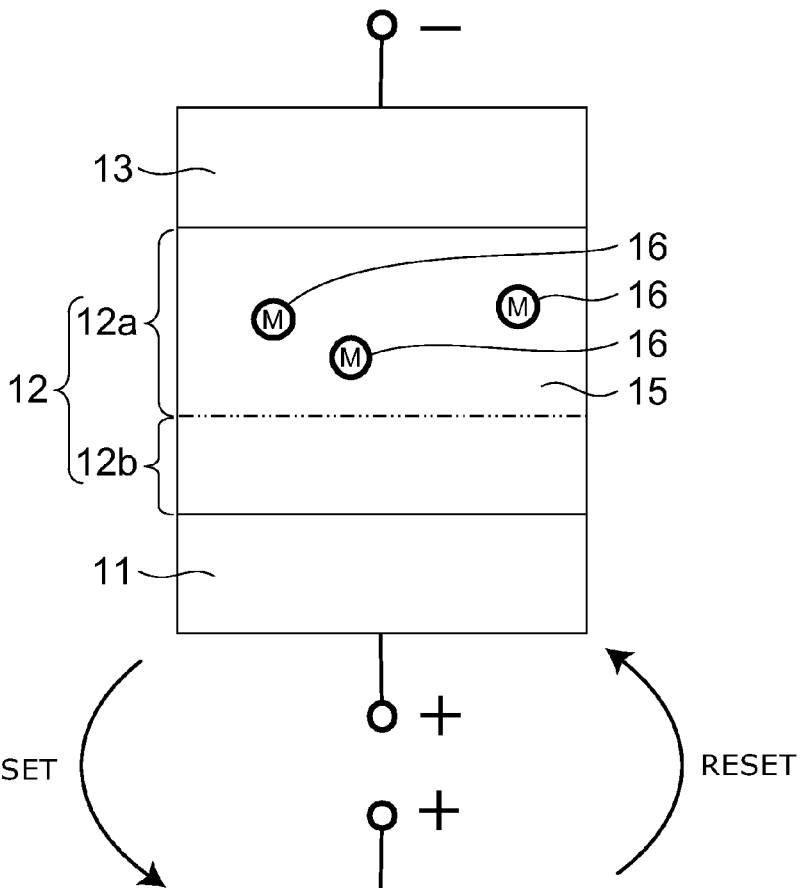
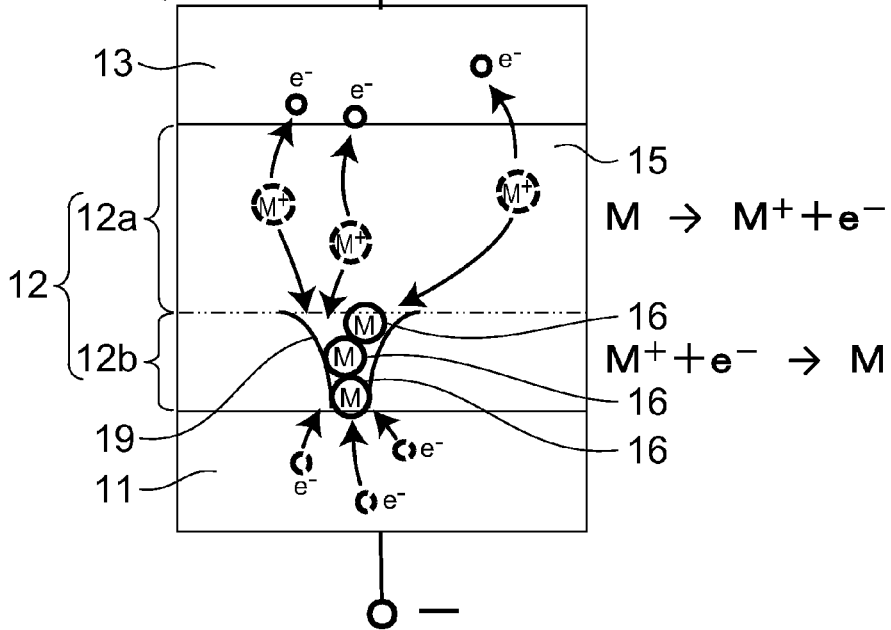

MEMORY DEVICE

CROSS-REFERENCE TO RELATED APPLICATIONS

This application is based upon and claims the benefit of priority from the prior Japanese Patent Application No. 2012-199766, filed on Sep. 11, 2012; the entire contents of which are incorporated herein by reference.

FIELD

Embodiments described herein relate generally to a memory device.

BACKGROUND

A resistance random access memory (ReRAM) has thus far been proposed. The ReRAM is a memory device including a memory cell that can be switched between a high resistance state (OFF state) and a low resistance state (ON state) by means of a voltage applied. The memory cell includes a resistance change film connected between two electrodes, and changes the resistance state of the resistance change film by passing a current between the electrodes. Since the ReRAM, because of its structure, is easy to miniaturize and provides a short programming time as compared to charge storage flash memories, the ReRAM is counted on as a next-generation nonvolatile memory and is under development.

For the ReRAM, an oxygen deficiency-type ReRAM in which an oxygen-deficient portion is produced in a metal oxide film to form a current path and a metal filament-type ReRAM in which a metal filament is deposited in an insulating film to form a current path are proposed. The oxygen deficiency-type ReRAM needs a certain level of current in order to change the resistance state of the resistance change film, and therefore has difficulty in current scaling necessary for miniaturization. In addition, since the interconnection resistance increases with miniaturization, the effect of the RI drop during current passage (the voltage drop) increases to make circuit operations difficult. On the other hand, in the metal filament-type ReRAM, metal ions are diffused and precipitated in an insulating film to form a fine line of the metal in the insulating film, and a low resistance state is thereby obtained. Thus, operations at low current are possible as compared to the oxygen deficiency-type ReRAM, and the number of fine lines decreases with miniaturization; therefore, current scaling in accordance with miniaturization is possible.

BRIEF DESCRIPTION OF THE DRAWINGS

FIGS. 5A and 5B are diagrams illustrating operations of the memory device according to the first embodiment schematically;

DETAILED DESCRIPTION

In general, according to one embodiment, a memory device includes a first electrode, a second electrode and a resistance change film. The resistance change film is connected between the first electrode and the second electrode. An ion metal is introduced in a matrix material in the resistance change film. A concentration of the ion metal in a first region on the first electrode side of the resistance change film is higher than a concentration of the ion metal in a second region on the second electrode side of the resistance change film A layer made of only the ion metal is not provided in the memory device.

Hereinbelow, embodiments of the invention are described with reference to the drawings.

First, a first embodiment is described.

Figure 1A:
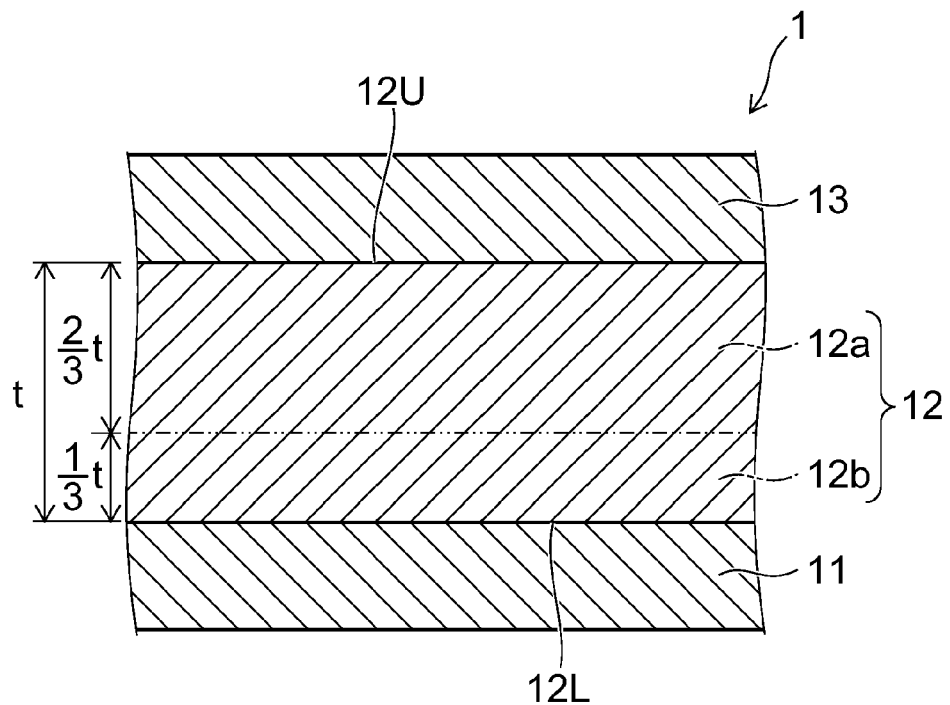
FIG. 1A is a cross-sectional view illustrating a memory device according to a first embodiment.
Figure 1B:
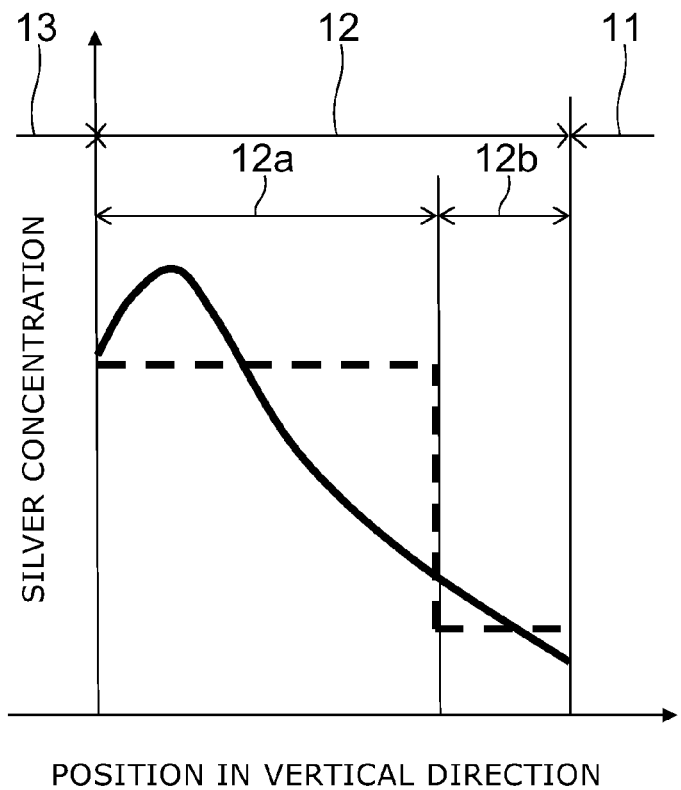
FIG. 1B is a graph illustrating a silver concentration profile in a resistance change film.

FIG. 1A is a cross-sectional view illustrating a memory device according to the embodiment, and FIG. 1B is a graph illustrating a silver concentration profile in a resistance change film, with the position in the vertical direction on the horizontal axis and the silver concentration on the vertical axis.

As shown in FIGS. 1A and 1B, a memory device 1 according to the embodiment is a metal filament-type ReRAM. FIGS. 1A and 1B show one memory cell provided in the memory device 1.

As shown in FIG. 1A, in each memory cell of the memory device 1 according to the embodiment, a lower electrode 11 is provided, a resistance change film 12 is provided on the lower electrode 11, and an upper electrode 13 is provided on the resistance change film 12. The resistance change film 12 is connected between the lower electrode 11 and the upper electrode 13. In this specification, "upper" and "lower" are for the sake of convenience, and are irrelevant to the direction of gravity. The lower electrode 11 and the upper electrode 13 are made of a conductive material, and are formed by, for example, a metal such as tungsten (W), molybdenum (Mo), titanium (Ti), or tantalum (Ta), an oxide or a nitride of any of these metals, polysilicon doped with an impurity, or the like.

The resistance change film 12 is formed by introducing an ion metal into a matrix material. The ion metal is a metal that has a lower electric resistivity than the matrix material and is ionized more easily than the matrix material. The matrix material is a material that can diffuse the ion metal. In the embodiment, the matrix material is, for example, amorphous silicon (a-Si), and the ion metal is, for example, silver (Ag).

The film thickness of the resistance change film 12 is, for example, not less than 1 nm and not more than 100 nm.

As shown in FIG. 1A, an upper portion, that is, a portion on the upper electrode 13 side of the resistance change film 12 forms an upper region 12a. A lower portion, that is, a portion on the lower electrode 11 side of the resistance change film 12 forms a lower region 12b. For example, the upper region 12a is a portion extending at a distance of two thirds or less of the film thickness t of the resistance change film 12 from a surface (upper surface) 12U on the upper electrode 13 side of the resistance change film 12, and the lower region 12b is a portion extending at a distance of one third or less of the film thickness t of the resistance change film 12 from a surface (lower surface) 12L on the lower electrode 11 side of the resistance change film 12. That is, the upper region 12a and the lower region 12b are stacked in the vertical direction; and the thickness of the upper region 12a is (2t/3) and the thickness of the lower region 12b is (t/3). A distinct interface may not be observed between the upper region 12a and the lower region 12b.

As shown in FIG. 1B, the concentration of the ion metal (silver) in the upper region 12a is higher than that in the lower region 12b. For example, the concentration of silver in the upper region 12a is not less than $1 \times 10^{18}$ (atoms/cm$^3$) and not more than $2 \times 10^{22}$ (atoms/cm$^3$), and preferably not less than $1 \times 10^{20}$ (atoms/cm$^3$) and not more than $1 \times 10^{22}$ (atoms/cm$^3$). The concentration of silver in the lower region 12b is lower than the silver concentration in the upper region 12a, and is $1 \times 10^{21}$ (atoms/cm$^3$) or less and preferably $8 \times 10^{18}$ (atoms/cm$^3$) or less. The resistivity of the lower region 12b is $8 \times 10^4$ ($\Omega \cdot$m) or more, and preferably $2 \times 10^5$ ($\Omega \cdot$m) or more.

The concentration profile of silver along the vertical direction in the resistance change film 12 may be a curved profile having a peak in the upper region 12a as shown by the solid line in FIG. 1B, or may be a profile near a step-like form that is uniform in each of the upper region 12a and the lower region 12b as shown by the broken line in FIG. 1B. However, as shown in FIG. 1A, a layer made of the ion metal or its compound is not provided in each memory cell of the memory device 1.

Next, a method for manufacturing a memory device according to the embodiment is described.

FIGS. 2A to 2D, FIGS. 3A to 3D, and FIGS. 4A to 4D are cross-sectional views illustrating a method for manufacturing a memory device according to the embodiment.

In each of FIG. 2A to FIG. 4D, the left figure shows a cross section parallel to the direction in which the upper electrode 13 extends, and the right figure shows a cross section parallel to the direction in which the lower electrode 11 extends. The left figure and the right figure in each drawing show cross sections orthogonal to each other in the same process.

Figure 2A:
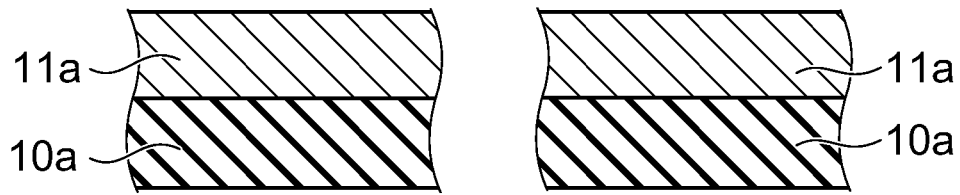
FIGS. 2A to 2D, FIGS. 3A to 3D, and FIGS. 4A to 4D are cross-sectional views illustrating a method for manufacturing a memory device according to the first embodiment.

First, as shown in FIG. 2A, a conductive material, for example, a metal such as tungsten (W), molybdenum (Mo), titanium (Ti), or tantalum (Ta), an oxide or a nitride of any of these metals, polysilicon doped with an impurity, or the like is deposited on an interlayer insulating film 10a to form a conductive film 11a.

Figure 2B:
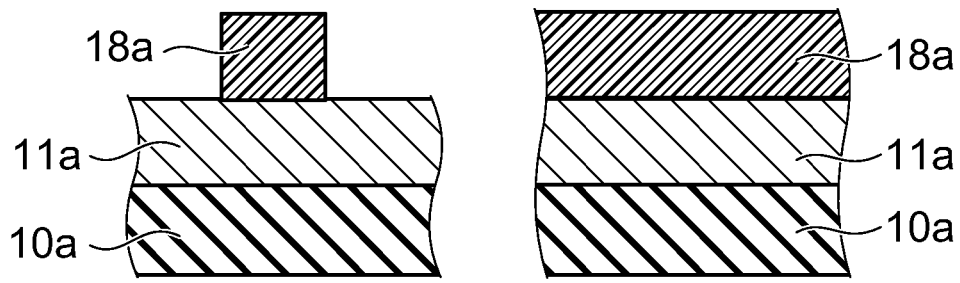

Next, as shown in FIG. 2B, a resist film is film-formed on the conductive film 11a, and is processed by lithography technology into a resist pattern 18a in a striped configuration extending in one direction.

Figure 2C:
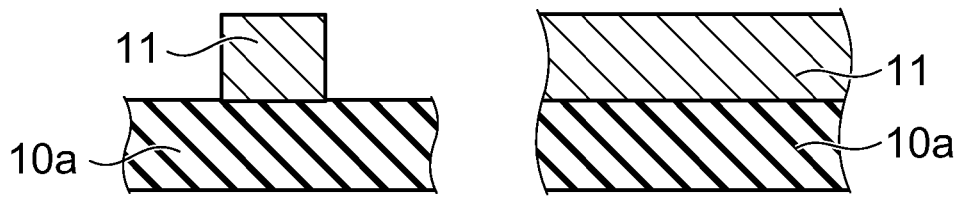

Next, as shown in FIG. 2C, the resist pattern 18a is used as a mask to perform anisotropic etching such as RIE (reactive ion etching) to selectively remove the conductive film 11a. Thereby, lower electrodes 11 are formed from the conductive film 11a. The lower electrodes 11 may be, for example, in an interconnection configuration extending in one direction, or may have a configuration in which a plurality of lower electrodes 11 are arranged parallel to one another. After that, the resist pattern 18a is removed.

Figure 2D:
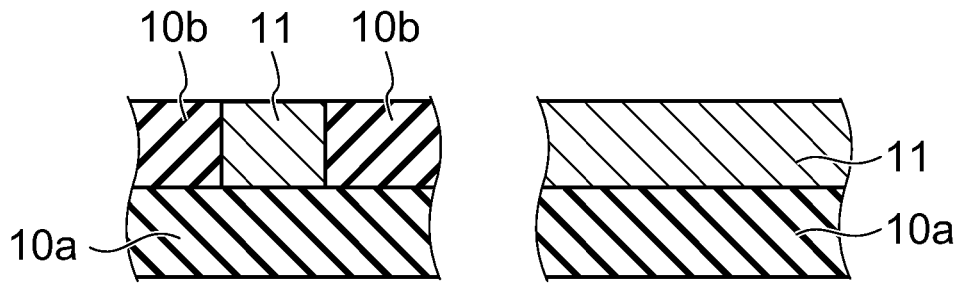

Next, as shown in FIG. 2D, an insulating material is buried between lower electrodes 11, and planarization is performed by CMP (chemical mechanical polishing) etc. to form an interlayer insulating film 10b.

Figure 3A:
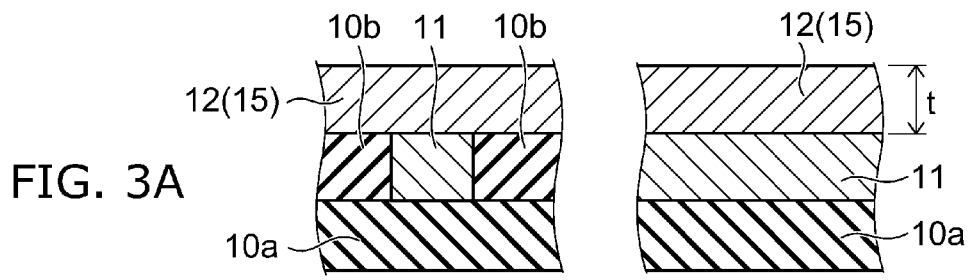

Next, as shown in FIG. 3A, a matrix material such as, for example, amorphous silicon (a-Si) is deposited to film-form a matrix material film 15. The film thickness t of the matrix material film 15 is set not less than 1 nm and not more than 100 nm, and is determined in accordance with the characteristics required for the memory cell. A barrier metal layer for improving the adhesion, for example, may be formed between the lower electrode 11 and the matrix material film 15 as necessary.

Next, an ion metal such as, for example, silver (Ag) is introduced into the matrix material film 15. Thereby, the resistance change film 12 is formed. At this time, the concentration distribution of the ion metal in the resistance change film 12 is set such that the ion metal concentration in the upper region 12a of the resistance change film 12 is higher than the ion metal concentration in the lower region 12b of the resistance change film 12.

As the method for introducing an ion metal into the matrix material film 15, for example, a method using ion implantation, a method using thermal diffusion, and a method in which the ion metal is introduced during the film-formation are given.

In the case of the introduction using the ion implantation method, after the matrix material film 15 is film-formed, an ion metal is ion-implanted while the acceleration voltage and the dose amount are adjusted, and thereby a desired concentration distribution is obtained. It is also possible to form a dummy layer on the matrix material film 15, perform ion implantation through the dummy layer, and then remove the dummy layer, as necessary.

In the case of the introduction using the thermal diffusion method, after the matrix material film 15 is film-formed, an ion metal layer made of an ion metal is formed thereon, and heat treatment is performed to diffuse the ion metal in the ion metal layer into the matrix material film 15; thereby, the concentration distribution described above is obtained. After that, the ion metal layer is removed. A barrier layer that suppresses the diffusion of the ion metal may be formed between the matrix material film 15 and the ion metal layer as necessary. For example, when the matrix material is amorphous silicon and the ion metal is silver, since the diffusion speed of silver in silicon is very high, the control of thermal diffusion is difficult. In view of this, a silicon oxide layer or a silicon nitride layer may be formed as a barrier layer between the matrix material layer 15 (an amorphous silicon layer) and the ion metal layer (a silver layer), and the thickness of the barrier layer and the temperature for the thermal diffusion may be adjusted. Thereby, it becomes easy to control the concentration distribution of silver in the amorphous silicon layer appropriately.

It is also possible to introduce an ion metal simultaneously with the film-formation of the matrix material film. In this case, the matrix material and the ion metal are alternately deposited by the CVD (chemical vapor deposition) method or the PVD (physical vapor deposition) method. At this time, a desired concentration distribution can be obtained by controlling the ratio between the amount of the matrix material deposited and the amount of the ion metal deposited. Alternatively, also any structures can be formed by depositing with a material containing an ion metal.

The resistance change film 12 is formed by any one of the above methods.

Figure 3B:
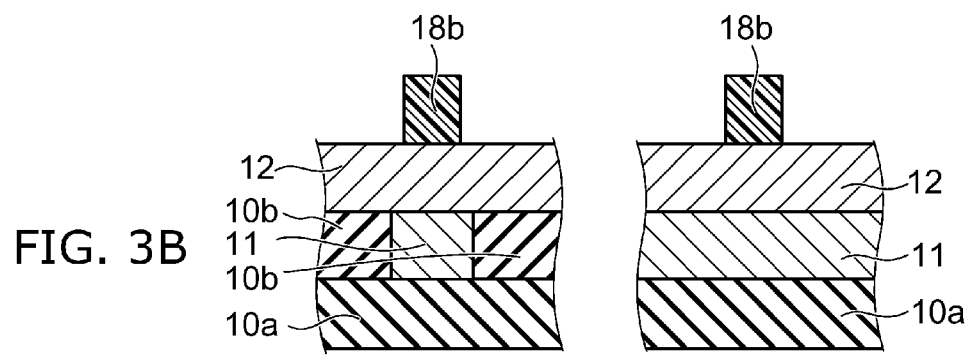

Next, as shown in FIG. 3B, a resist film is film-formed on the resistance change film 12, and is processed by lithography technology. Thereby, a resist pattern 18b of circular columnar shapes is formed on the resistance change film 12.

Figure 3C:
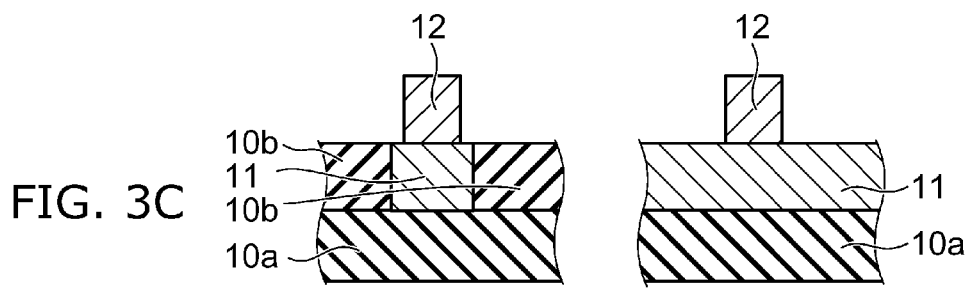

Next, as shown in FIG. 3C, the resist pattern 18b is used as a mask to perform RIE to selectively remove the resistance change film 12. Thereby, the resistance change film 12 is processed into pillar forms in circular columnar shapes. After that, the resist pattern 18b is removed.

Figure 3D:
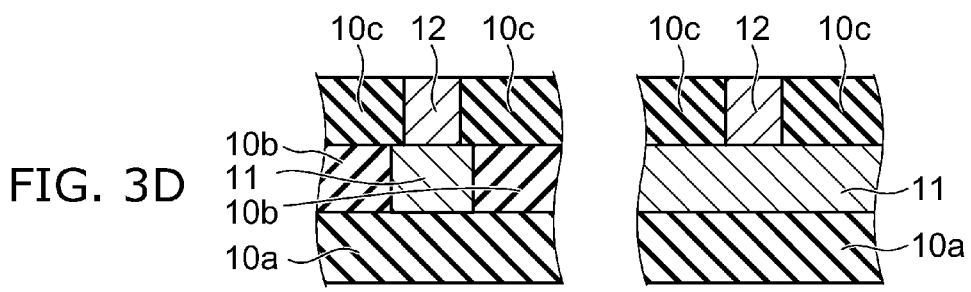

Next, as shown in FIG. 3D, an insulating material is buried between resistance change films 12, and the upper surface is planarized by CMP etc. to form an interlayer insulating film 10c.

Figure 4A:
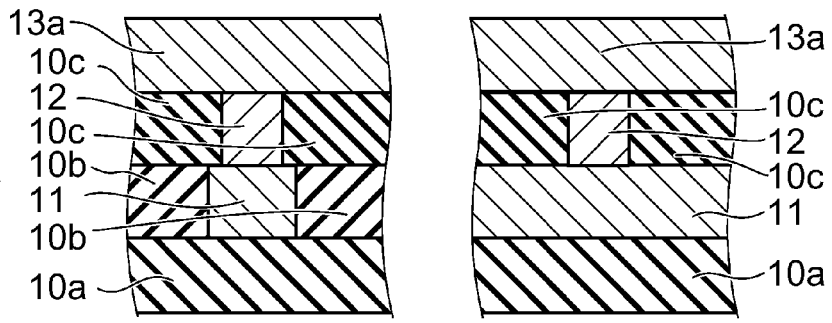

Next, as shown in FIG. 4A, a conductive material, for example, the same conductive material as the conductive material forming the lower electrode 11 is deposited on the resistance change film 12 and the interlayer insulating film 10c to film-form a conductive film 13a. At this time, a barrier metal layer for improving the adhesion, for example, may be formed between the resistance change film 12 and the conductive film 13a, but a layer made of only the ion metal is not formed.

Figure 4B:
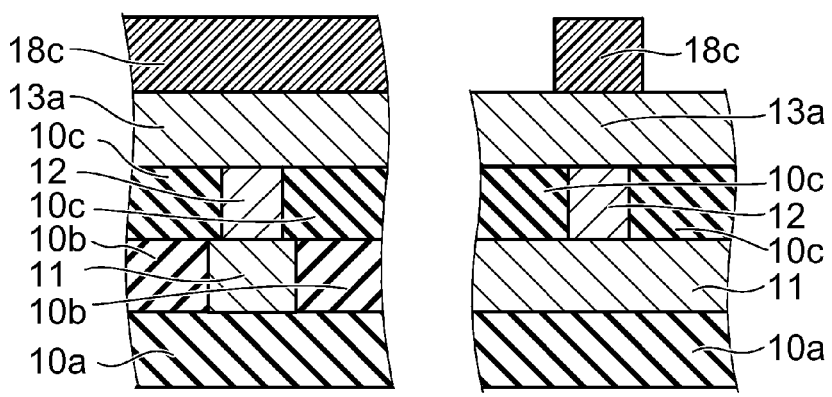

Next, as shown in FIG. 4B, a resist film is film-formed on the conductive film 13a. Next, the resist film is patterned by lithography technology to form a resist pattern 18c on the conductive film 13a. The resist pattern 18c has, for example, a striped configuration extending in a direction orthogonal to the direction in which the lower electrode 11 extends.

Figure 4C:
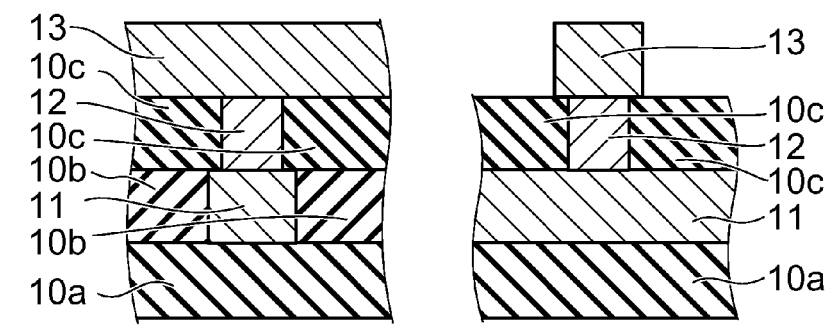

Next, as shown in FIG. 4C, the resist pattern 18c is used as a mask to perform RIE to selectively remove the conductive film 13a for patterning. Thereby, the conductive film 13a is divided into a plurality of upper electrodes 13. After that, the resist pattern 18c is removed.

Figure 4D:
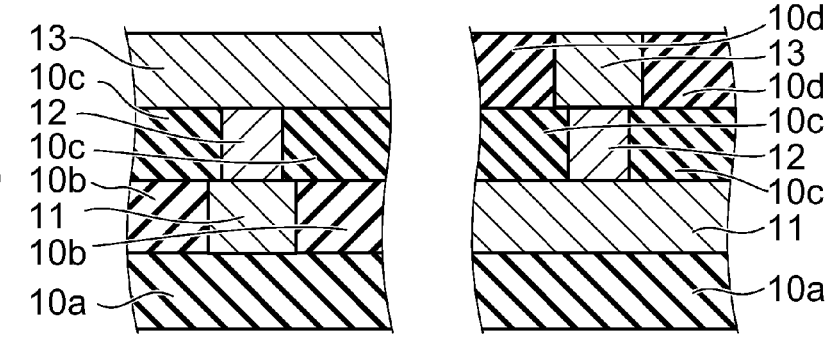

Next, as shown in FIG. 4D, an insulating material is buried between upper electrodes 13, and the upper surface is planarized by CMP etc. to form an interlayer insulating film 10d. Thus, the memory device 1 is manufactured.

Next, operations of the embodiment are described.

FIGS. 5A and 5B are diagrams illustrating operations of the memory device according to the embodiment schematically; FIG. 5A shows the high resistance state and FIG. 5B shows the low resistance state.

As shown in FIG. 5A, in the resistance change film 12 in the high resistance state, atoms of an ion metal 16 are scattered in a matrix material 15. At this time, the upper region 12a of the resistance change film 12 is in a state where the concentration of the ion metal 16 is high and the electric resistance is low, whereas the lower region 12b is in a state where the concentration of the ion metal 16 is low and the electric resistance is high; and the whole resistance change film 12 is in a state where the electric resistance value in the film thickness direction is high.

Next, the set operation, that is, an operation in which the resistance change film 12 is transitioned from the high resistance state to the low resistance state is described.

As shown in FIG. 5B, when such a voltage as to make the upper electrode 13 a positive pole and the lower electrode 11a negative pole is applied, in the upper region 12a, an electron (e⁻) is separated from the atom (M) of the ion metal 16 and the ion metal 16 becomes a cation (M⁺). That is, the reaction of Reaction Formula (1) below proceeds.

$$M \rightarrow M^+ + e^-  \quad (1)$$

The separated electron (e⁻) is released through the upper electrode 13, which is a positive pole. On the other hand, the cation (M⁺) is attracted to the lower electrode 11, which is a negative pole, and enters the lower region 12b. Then, in the lower region 12b, the cation (M⁺) binds to an electron (e⁻) supplied via the lower electrode 11, and the ion metal 16 precipitates as a simple substance (M). That is, the reaction of Reaction Formula (2) below proceeds.

$$M^+ + e^- \rightarrow M \quad (2)$$

By a series of such reactions, a metal filament 19 made of the ion metal is formed in the lower region 12b, and is connected between the upper region 12a and the lower electrode 11. Consequently, the metal filament 19 forms a current path extending in the film thickness direction, and the resistance change film 12 is switched to the low resistance state.

Next, the reset operation, that is, an operation in which the resistance change film 12 is transitioned from the low resistance state to the high resistance state is described.

Starting from the state shown in FIG. 5B, such a voltage as to make the upper electrode 13 a negative pole and the lower electrode 11a positive pole is applied as shown in FIG. 5A. Thereby, an electron (e⁻) is separated from the atom (M) of the ion metal 16 forming the metal filament 19 to produce a cation (M⁺). That is, the reaction of Reaction Formula (1) mentioned above proceeds in the lower region 12b. Thereby, the separated electron (e⁻) is released via the lower electrode 11, which is a positive pole, and the cation (M⁺) is attracted to the upper electrode 13, which is a negative pole, to return into the upper region 12a. Then, the cation binds to an electron (e⁻) supplied via the upper electrode 13 to return to the simple substance (M). That is, the reaction of Reaction Formula (2) mentioned above proceeds in the upper region 12a. Consequently, at least part of the metal filament 19 is lost in the lower region 12b, and the lower region 12b is insulated from the lower electrode 11. Thereby, the current path in the film thickness direction is cut off, and the condition returns to the high resistance state.

Thus, the resistance state of the resistance change film 12 can be switched by the set operation and the reset operation. Values can be stored in the memory cell to correspond to the resistance states of the resistance change film 12. Furthermore, by detecting the resistance state of the resistance change film 12, the value stored in each memory cell can be read out. In the set operation and the reset operation, the upper region 12a of the resistance change film 12 functions as an ion metal source and the lower region 12b functions as a region for metal filament formation.

Next, effects of the embodiment are described.

As described above, the operation of the metal filament-type ReRAM is based on a phenomenon in which an ion metal is ionized to move and precipitates as a simple substance in the destination. In this regard, the ion metal needs to be a metal that is easily ionized and easily diffuses through the matrix material. However, such metals are mostly thermally and chemically unstable materials, and have low resistance to thermal loads and chemical loads. Hence, the ion metal is likely to cause various problems in the manufacturing processes of the memory device.

In view of this, in the embodiment, a layer made of only the ion metal is not provided, and the ion metal necessary for the formation of the metal filament 19 is introduced into the resistance change film 12 beforehand. Furthermore, the ion metal concentration in the upper region 12a of the resistance change film 12 is set higher than the ion metal concentration in the lower region 12b.

Thereby, as described above, when such a voltage as to make the upper electrode 13 a positive pole and the lower electrode 11a negative pole is applied as shown in FIG. 5B in the time of the high resistance state shown in FIG. 5A, the ion metal contained in the upper region 12a is ionized to move to the lower region 12b, and precipitates in the lower region 12b to form the metal filament 19; thus, the condition becomes the low resistance state. In this manner, the set operation can be performed.

Furthermore, as described above, when such a voltage as to make the upper electrode 13 a negative pole and the lower electrode 11 a positive pole is applied as shown in FIG. 5A in the time of the low resistance state shown in FIG. 5B, the ion metal contained in the metal filament 19 is ionized to move to the upper region 12a, and precipitates in the upper region 12a. Consequently, at least part of the metal filament 19 is lost from the lower region 12b, and the condition becomes the high resistance state. Thereby, the reset operation can be performed.

Thus, by the embodiment, the switching operation is enabled by setting the concentration distribution of the ion metal in the resistance change film 12 in the manner described above, without providing a layer made of only an unstable ion metal. Since a layer made of only the ion metal is not provided in the memory device 1, the memory device 1 has high resistance to thermal loads and chemical loads applied in the manufacturing processes thereof and has high manufacturing stability. For example, in the process shown in FIG. 3C, the resistance change film 12 can be easily processed. Thereby, a memory device with high operational stability even when miniaturized can be obtained.

Furthermore, by not forming a layer made of only the ion metal, the aspect ratio of the pillar including the resistance change film 12 can be reduced and the number of processes can be reduced as compared to the case where the layer is formed. Also by this, the manufacturing of the memory device becomes easy and manufacturing costs can be reduced.

A distinct interface may not be observed between the upper region 12a and the lower region 12b. In the embodiment, when the film thickness of the whole resistance change film 12 is denoted by t, a portion extending (2t/3) in thickness from the side of the upper electrode 13, that is, the electrode serving as a positive pole in the set operation is defined as the upper region 12a, and a portion extending (t/3) in thickness from the side of the lower electrode 11, that is, the electrode serving as a negative pole in the set operation is defined as the lower region 12b. The ratio of thickness is found out experimentally.

In the resistance change film 12, it is sufficient that the average concentration of the ion metal in the upper region 12a be higher than the average concentration of the ion metal in the lower region 12b. That is, electrical characteristics can be discussed on the assumption that there is no concentration gradient in each portion as shown by the broken line in FIG. 1B, even if the actual concentration profile has a certain distribution in each of the upper region 12a and the lower region 12b as shown by the solid line in FIG. 1B. Also this is found out by experimental facts. Thus, quantitative discussion regarding the ion metal concentration is made by the average value of each region. The reasons for the numerical limitation in the embodiment will now be described.

(1) The silver concentration in the upper region 12a: $1 \times 10^{18}$ (atoms/cm$^3$) to $2 \times 10^{22}$ (atoms/cm$^3$)

The concentration of the ion metal in the upper region 12a of the resistance change film 12 is mainly determined from the balance between the characteristics of switching and the ease of manufacturing. An example in the case where silver is used as the ion metal and amorphous silicon is used as the matrix material is described below.

Figure 6:
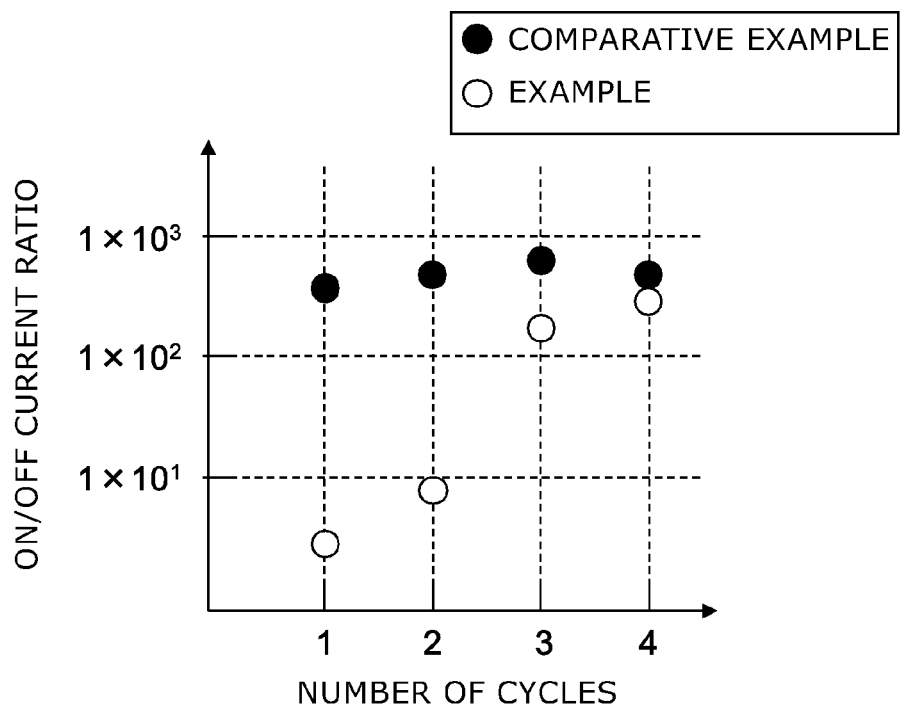
FIG. 6 is a graph illustrating the ease of the formation of the metal filament.

FIG. 6 is a graph illustrating the ease of the formation of the metal filament, with the number of cycles on the horizontal axis and the ON/OFF current ratio on the vertical axis.

The "ON/OFF current ratio" shown on the vertical axis of FIG. 6 indicates the value of the ratio of the ON current $I_{on}$ to the OFF current $I_{off}$ at a certain voltage. In FIG. 6, the memory device according to the example of the embodiment, that is, a memory device in which a silver layer is not provided is shown by white circles, and a memory device according to a comparative example, that is, a memory device in which a silver layer is provided between the resistance change film and the upper electrode is shown by black circles.

As shown in FIG. 6, in the memory device according to the comparative example in which a silver layer is provided, by one voltage application, a metal filament is formed in the resistance change film and a sufficient ON/OFF current ratio can be obtained. In contrast, in the memory device according to the example in which a silver layer is not provided, a metal filament is rarely formed in a complete manner in the resistance change film by one voltage application, and about several voltage cycles are usually needed. The lower the silver concentration in the upper region 12a is, the more the number of voltage cycles until a metal filament is formed is. A still lower silver concentration leads to an increased probability with which a metal filament is not formed even upon application of a sufficient number of voltage cycles. That is, the switching probability is reduced.

Figure 7:
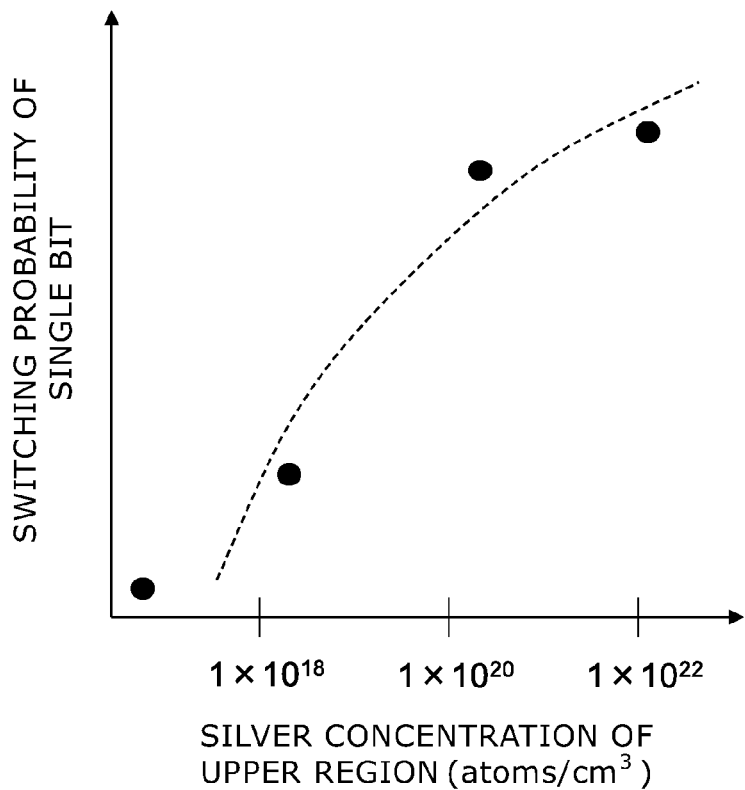
FIG. 7 is a graph illustrating the influence of the silver concentration of the upper region on the switching probability of the memory cell.

FIG. 7 is a graph illustrating the influence of the silver concentration of the upper region on the switching probability of the memory cell, with the silver concentration of the upper region of the resistance change film on the horizontal axis and the switching probability of a single bit on the vertical axis.

As shown in FIG. 7, when the silver concentration of the upper region 12a is $1 \times 10^{18}$ (atoms/cm$^3$) or more, the switching probability is high; when the silver concentration is $1 \times 10^{20}$ (atoms/cm$^3$) or more, the switching probability is particularly high. Thus, the silver concentration of the upper region 12a is preferably $1 \times 10^{18}$ (atoms/cm$^3$) or more, and more preferably $1 \times 10^{20}$ (atoms/cm$^3$) or more.

On the other hand, if the ion metal concentration of the upper region 12a is high, although switching characteristics are stabilized, the amount of residual substances produced in processing processes such as RIE and CMP is increased to increase the degree of process difficulty.

Figure 8:
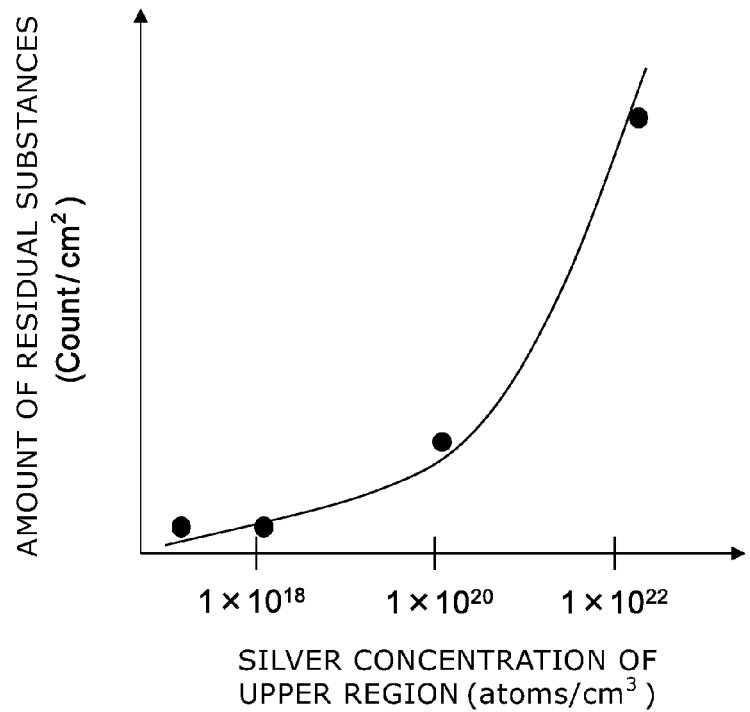
FIG. 8 is a graph illustrating the influence of the silver concentration on the amount of residual substances.

FIG. 8 is a graph illustrating the influence of the silver concentration on the amount of residual substances, with the silver concentration of the upper region on the horizontal axis and the amount of residual substances produced on the vertical axis.

FIG. 8 shows the number density of residual substances remaining on the surface when a resistance change film in which silver is introduced into amorphous silicon is processed by RIE using $CHF_3$ gas. Most of the residual substances are reaction products resulting from the RIE processing, and the main components thereof are halogen compounds of silver. Since halogen compounds of silver have high melting points and low vapor pressures, the removal of them is difficult. Hence, if the amount of residual substances is large, processing by ordinary semiconductor processes is difficult. Furthermore, silver is vulnerable to thermal loads; and when the silver concentration in amorphous silicon is too high, silver may cohere in the amorphous silicon to form a starting point of film peeling in manufacturing processes.

As shown in FIG. 8, the higher the silver concentration of the upper region 12a is, the larger the amount of residual substances is; and when the silver concentration exceeds a certain value, the amount of residual substances increases steeply. However, when the silver concentration in the upper region 12a is $2\times10^{22}$ (atoms/cm$^3$) or less, the amount of residual substances does not become too much, and handling in ordinary semiconductor processes is possible. Thus, the silver concentration in the upper region 12a is preferably $2\times10^{22}$ (atoms/cm$^3$) or less, and more preferably $1\times10^{22}$ (atoms/cm$^3$) or less.

Summarizing the above, from the viewpoints of the switching probability and the difficulty of manufacturing, the concentration of silver in amorphous silicon in the upper region 12a is preferably set not less than $1\times10^{18}$ (atoms/cm$^3$) and not more than $2\times10^{22}$ (atoms/cm$^3$), and more preferably set not less than $1\times10^{20}$ (atoms/cm$^3$) and not more than $1\times10^{22}$ (atoms/cm$^3$).

(2) The resistivity of the lower region: $8\times10^4$ (Ω·m) or more

The ion metal concentration of the lower region 12b of the resistance change film 12 is determined from the resistivity of the lower region 12b. If the resistivity of the lower region 12b is low, an electric field is applied less easily to the lower region 12b. Consequently, even if the ion metal is ionized in the upper region 12a, the cation of the ion metal cannot move through the lower region 12b and a metal filament cannot be formed.

Figure 9:
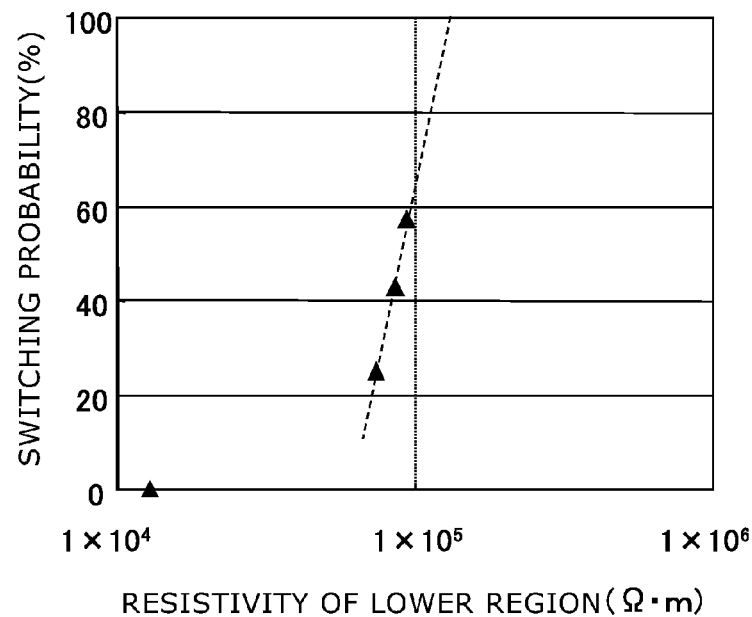
FIG. 9 is a graph illustrating the influence of the resistivity of the lower region on the switching probability.

FIG. 9 is a graph illustrating the influence of the resistivity of the lower region on the switching probability, with the resistivity of the lower region of the resistance change film on the horizontal axis and the switching probability of the memory cell on the vertical axis.

As shown in FIG. 9, there is a positive correlation between the resistivity of the lower region 12b and the switching probability of the memory cell. When the resistivity of the lower region 12b is $8\times10^4$ (Ω·m) or more, a certain switching probability can be obtained; and when the resistivity is $2\times10^5$ (Ω·m) or more, a switching probability of almost 100% can be obtained. Thus, the resistivity of the lower region 12b is preferably $8\times10^4$ (Ω·m) or more, and more preferably $2\times10^5$ (Ω·m) or more.

(3) The silver concentration of the lower region: $1\times10^{21}$ (atoms/cm$^3$) or less FIG. 10 is a graph illustrating the relationship between the silver concentration and the resistivity, with the silver concentration of the lower region of the resistance change film on the horizontal axis and the resistivity on the vertical axis.

Figure 11:
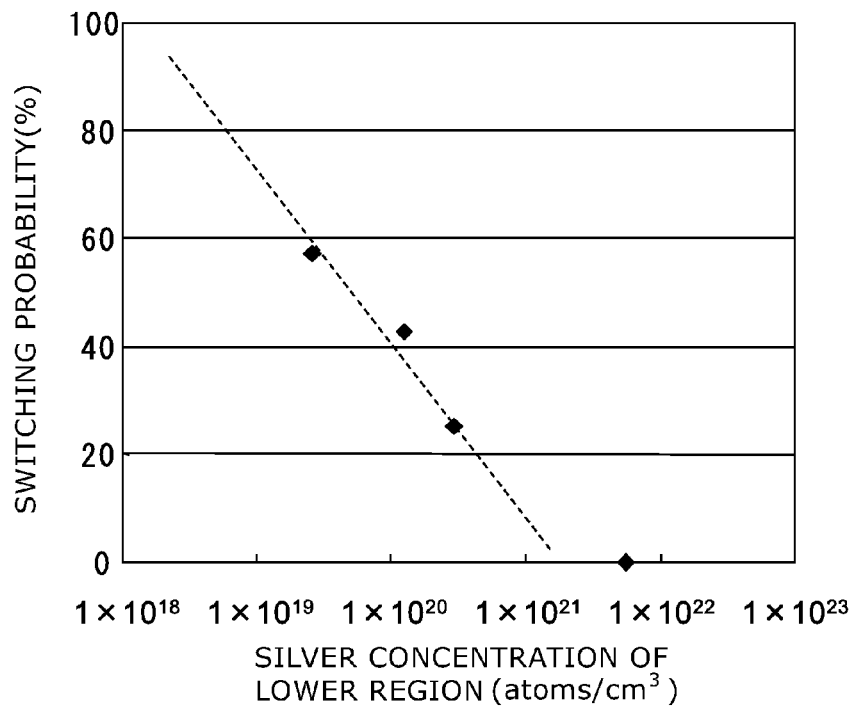
FIG. 11 is a graph illustrating the influence of the silver concentration of the lower region on the switching probability.

FIG. 11 is a graph illustrating the influence of the silver concentration of the lower region on the switching probability, with the silver concentration of the lower region of the resistance change film on the horizontal axis and the switching probability of the memory cell on the vertical axis.

Figure 10:
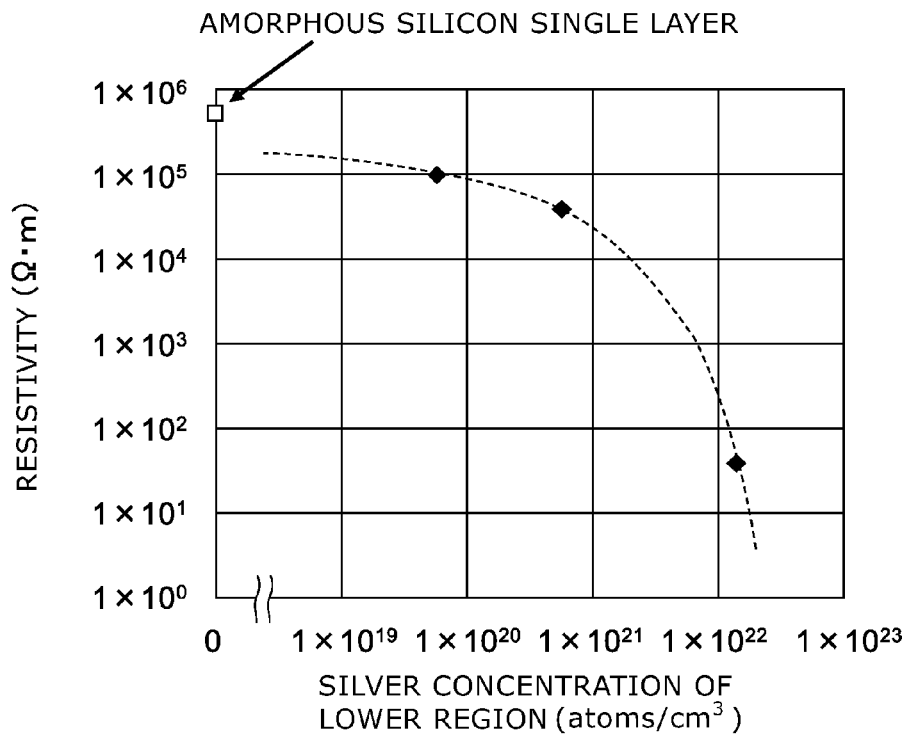
FIG. 10 is a graph illustrating the relationship between the silver concentration and the resistivity.

In the case where amorphous silicon is used as the matrix material and silver is used as the ion metal, as shown in FIG. 10 and FIG. 11, the silver concentration is preferably set to $1\times10^{21}$ (atoms/cm$^3$) or less in order to obtain a meaningful switching probability, and the silver concentration is preferably set to $8\times10^{18}$ (atoms/cm$^3$) or less in order to obtain a switching probability of almost 100%.

Next, a second embodiment is described.

Figure 12:
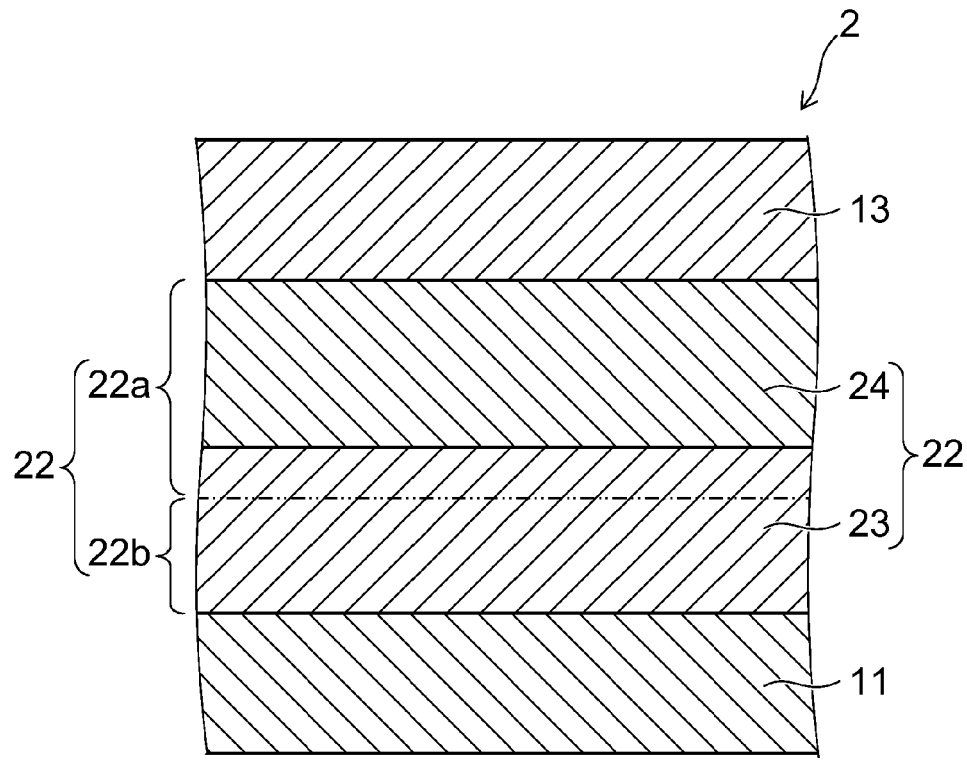
FIG. 12 is a cross-sectional view illustrating a memory device according to a second embodiment.

FIG. 12 is a cross-sectional view illustrating a memory device according to the embodiment.

As shown in FIG. 12, a memory device 2 according to the embodiment differs from the memory device 1 (see FIG. 1A) according to the first embodiment described above in that the resistance change film is a double layer film. That is, in the memory device 2, a resistance change film 22 is connected between the lower electrode 11 and the upper electrode 13; and in the resistance change film 22, a silicon oxide film 23 is provided on the lower layer side, an amorphous silicon film 24 is provided on the upper layer side, and silver is introduced in the entire resistance change film 22. That is, the matrix material of the silicon oxide film 23 is silicon oxide (SiO$_2$), the ion metal of the silicon oxide film 23 is silver (Ag), the matrix material of the amorphous silicon film 24 is amorphous silicon (a-Si), and the ion metal of the amorphous silicon film 24 is silver (Ag).

The whole of the amorphous silicon film 24 and an upper portion of the silicon oxide film 23 in the resistance change film 22 form an upper region 22a, and function as an ion metal source. On the other hand, a lower portion of the silicon oxide film 23 forms a lower region 22b, and functions as a region for the formation of a metal filament. Similarly to the first embodiment described above, the ion metal concentration of the upper region 22a is higher than the ion metal concentration of the lower region 22b. In this case, the ion metal concentration is investigated by the number of atoms per unit volume. The preferable range of the ion metal concentration in the upper region 22a and the lower region 22b and the preferable range of the resistivity of the lower region 22b are similar to those of the first embodiment described above.

In the embodiment, since the matrix material of the lower portion of the resistance change film 22, that is, the silicon oxide film 23 is silicon oxide, data retention properties are good as compared to cases like the first embodiment described above in which amorphous silicon is used as the matrix material of the whole resistance change film 12. Furthermore, in the embodiment, since the matrix material of the upper portion of the resistance change film 22, that is, the amorphous silicon film 24 is amorphous silicon, the operating voltage can be made low as compared to the case where silicon oxide is used as the matrix material of the whole resistance change film.

In general, in the case where silver is used as the ion metal, when the matrix material is amorphous silicon, the operating voltage can be reduced, but on the other hand data retention properties tend to be reduced. On the other hand, when the matrix material is silicon oxide, data retention properties are good, but the operating voltage tends to be increased. In view of this, in the embodiment, the resistance change film is formed by stacking a silicon oxide film and an amorphous silicon film; thereby, these properties are brought into balance, and a memory cell can be formed in which the operating voltage is kept low and at the same time data retention properties are high. In particular, by making the silicon oxide film 23 thinner than the amorphous silicon film 24, a significant increase in the operating voltage can be avoided.

In the case where the ion metal is film-formed by the sputtering method and is introduced into the resistance change film, silicon oxide is greatly damaged in sputtering as compared to amorphous silicon. Therefore, by forming part of the resistance change film out of amorphous silicon, the variation in the characteristics of the memory cell can be suppressed as compared to the case of being formed of only silicon oxide. For example, the leak current in the high resistance state (OFF leak) can be reduced.

Otherwise, the configuration, manufacturing method, operations, and effects of the embodiment are similar to those of the first embodiment described above.

Next, a third embodiment is described.

Figure 13:
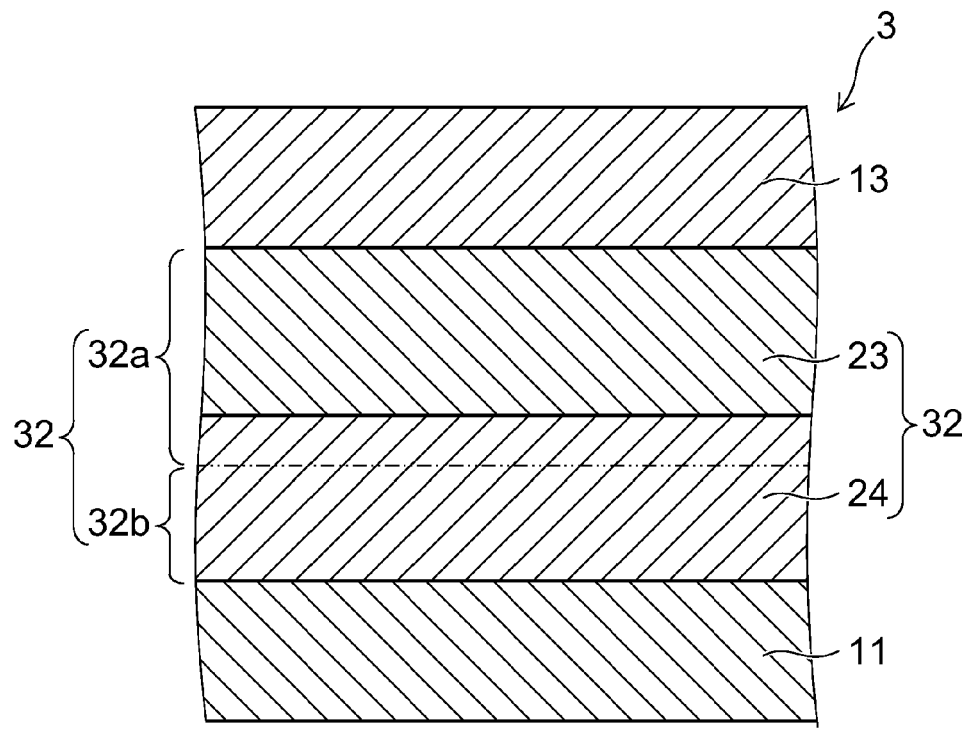
FIG. 13 is a cross-sectional view illustrating a memory device according to a third embodiment.

FIG. 13 is a cross-sectional view illustrating a memory device according to the embodiment.

As shown in FIG. 13, a memory device 3 according to the embodiment differs from the memory device 2 (see FIG. 12) according to the second embodiment described above in that in a resistance change film 32, the amorphous silicon film 24 is disposed on the lower layer side and the silicon oxide film 23 is disposed on the upper layer side.

In the embodiment, most of an upper region 32a of the resistance change film 32 is formed by the silicon oxide film 23. Since the resistivity of silicon oxide is higher than the resistivity of amorphous silicon, when a voltage is applied between the lower electrode 11 and the upper electrode 13, a high electric field is applied to silver atoms in the silicon oxide film 23. Therefore, in the time of the set operation, silver atoms in the upper region 32a are easily ionized. Consequently, the probability with which a metal filament is formed when a certain voltage is applied is high, and the switching probability is increased.

Figure 14:
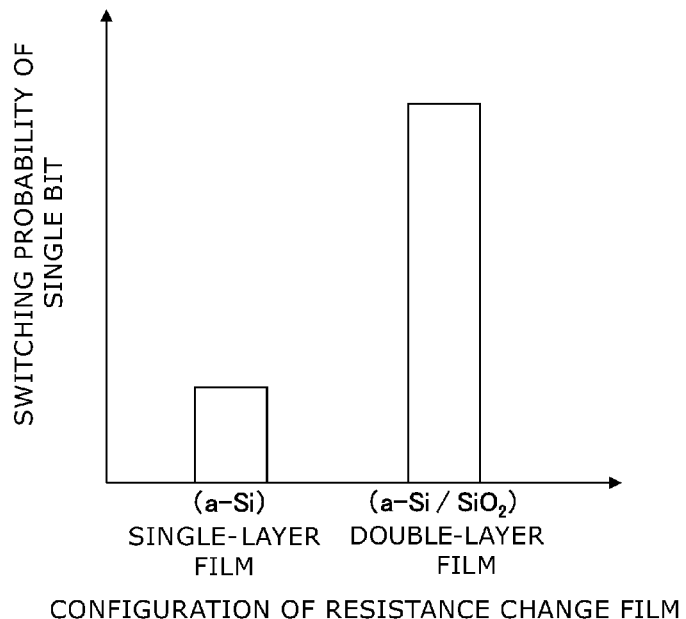
FIG. 14 is a graph illustrating the influence of the configuration of the resistance change film on the switching probability.

FIG. 14 is a graph illustrating the influence of the configuration of the resistance change film on the switching probability, with the configuration of the resistance change film on the horizontal axis and the switching probability of the memory cell on the vertical axis.

As shown in FIG. 14, a sample like the first embodiment described above in which amorphous silicon was used as the matrix material of the whole resistance change film (in FIG. 14, written as an "(a-Si) single-layer film") and a sample like the embodiment in which the amorphous silicon film 24 was disposed on the lower layer side of the resistance change film and the silicon oxide film 23 was disposed on the upper layer side (in FIG. 14, written as an "(a-Si/SiO$_2$) double layer film") were manufactured, and the switching probability of the memory cell was investigated under the same conditions. Silver was used as the ion metal. As a result, the sample "(a-Si/SiO$_2$) double layer film" exhibited a higher switching probability than the sample "(a-Si) single-layer film."

Otherwise, the configuration, manufacturing method, operations, and effects of the embodiment are similar to those of the second embodiment described above.

The structure of the resistance change film is not limited to a single-layer structure but may be a stacked structure to the extent that the ion metal concentration in the upper region of the resistance change film is higher than the ion metal concentration in the lower region, as shown in the second and third embodiments described above. Although examples in which the resistance change film is a double layer film are illustrated in the second and third embodiments, a multilayer film in which three or more layers are stacked is possible. As the matrix material of the silicon oxide film 23, silicon nitride or silicon oxynitride may be used instead of silicon oxide. Furthermore, as the matrix material of the amorphous silicon film 24, polysilicon may be used instead of amorphous silicon.

Next, a fourth embodiment is described.

Figures 15A, 15B:
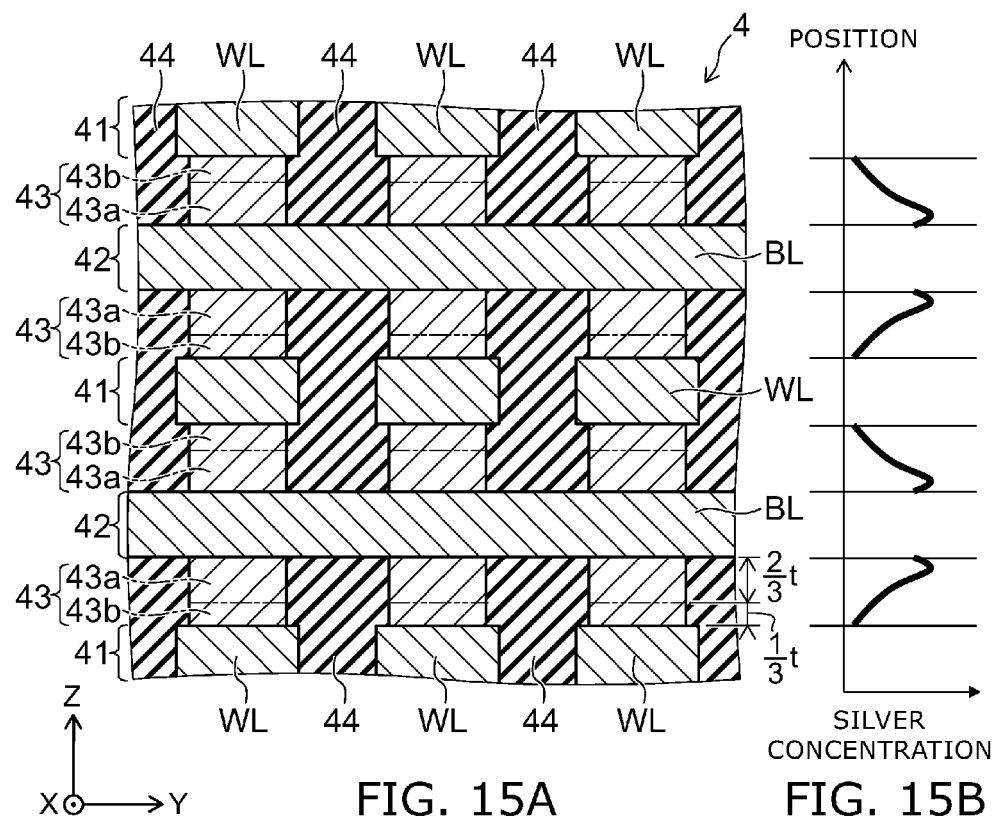
FIG. 15A is a cross-sectional view illustrating a memory device according to a forth embodiment.
FIG. 15B is a graph illustrating the concentration distribution of the ion metal.

FIG. 15A is a cross-sectional view illustrating a memory device according to the embodiment, and FIG. 15B is a graph illustrating the concentration distribution of the ion metal, with the position in the vertical direction (the Z direction) on the vertical axis and the silver concentration in the resistance change film on the horizontal axis.

As shown in FIG. 15A, in a memory device 4 according to the embodiment, a word line interconnection layer 41 and a bit line interconnection layer 42 are alternately stacked along the Z direction. In each word line interconnection layer 41, a plurality of word lines WL extending in the X direction on the same plane are periodically arranged. In each bit line interconnection layer 42, a plurality of bit lines BL extending in the Y direction on the same plane are periodically arranged. The X direction, the Y direction, and the Z direction are directions orthogonal to one another. A resistance change film 43 is connected between each word line WL and each bit line BL. The resistance change film 43 is formed by, for example, introducing silver as the ion metal into amorphous silicon as the matrix material. An interlayer insulating film 44 is disposed between the word line WL, the bit line BL, and the resistance change film 43.

As shown in FIG. 15B, in each resistance change film 43, the silver concentration changes along the Z direction. When the film thickness of the resistance change film 43 is denoted by t, the silver concentration in a bit line-side region 43a located on the bit line BL side and having a thickness of, for example, (2t/3) is higher than the silver concentration of a word line-side region 43b located on the word line WL side and having a thickness of, for example, (t/3).

One word line WL, one bit line BL, and one resistance change film 43 connected between them constitute one memory cell. Therefore, in the memory device 4, a plurality of memory cells are arranged in a three-dimensional matrix configuration. The word line WL and the bit line BL are shared between memory cells adjacent in the X direction, the Y direction, and the Z direction.

The structure of each memory cell is similar to the structure of the memory cell in the first embodiment described above (see FIG. 1A). That is, the word line WL, the bit line BL, the resistance change film 43, the bit line-side region 43a, and the word line-side region 43b in the embodiment correspond to the lower electrode 11, the upper electrode 13, the resistance change film 12, the upper region 12a, and the lower region 12b in the first embodiment, respectively. Also the preferable ranges of the silver concentration and the resistivity of each region are similar to those of the first embodiment described above.

The memory device 4 according to the embodiment can be manufactured by repeating the processes shown in FIG. 2A to FIG. 4D. However, in the case where the resistance change film 43 is formed on the bit line BL, the bit line-side region 43a with a relatively high ion metal concentration is located in the lower portion of the resistance change film 43 and the word line-side region 43b with a relatively low ion metal concentration is located in the upper portion. Therefore, it is necessary to introduce the ion metal 16 in the ion metal introduction process shown in FIG. 3A under such conditions that the ion metal concentration of the lower portion of the resistance change film 43 is higher than the ion metal concentration of the upper portion.

By the embodiment, since a cross-point structure can be obtained and memory cells can be integrated three-dimensionally, a memory device with a high storage density can be provided. Otherwise, the configuration, manufacturing method, operations, and effects of the embodiment are similar to those of the first embodiment described above.

Although the above embodiments are described using the case where the matrix material is amorphous silicon as an example, the matrix material is not limited thereto but may be polysilicon, for example. Furthermore, the matrix material may be a material other than silicon. For example, the matrix material may be one or more materials selected from the group consisting of silicon, silicon oxide, silicon nitride, silicon oxynitride, silicon sulfide, silicon chloride, hafnium oxide, hafnium nitride, a hafnium silicate compound, zirconium oxide, zirconium nitride, a zirconium silicate compound, aluminum oxide, aluminum nitride, an aluminum silicate compound, titanium oxide, titanium nitride, and a titanium silicate compound.

Although the above embodiments are described using the case where the ion metal is silver as an example, the ion metal is not limited to silver. For example, the ion metal may be one or more metals selected from the group consisting of gold, silver, copper, platinum, palladium, titanium, iron, chromium, cobalt, nickel, aluminum, indium, tellurium, sodium, and calcium.

The embodiments described above can provide a minute memory device with high operational stability.

Hereinabove, some embodiments of the invention are described, but these embodiments are shown as examples and do not intend to limit the scope of the invention. These novel embodiments can be practiced in various other forms, and various omissions, substitutions, and alterations may be made without departing from the spirit of the invention. These embodiments and modifications thereof are included in the scope and spirit of the invention and are included also in the scope of the invention described in the claims and equivalents thereof. Further, the embodiments described above may be practiced in combination.

What is claimed is:

1. A memory device comprising:
a first electrode;
a second electrode; and
a resistance change film connected between the first electrode and the second electrode,
wherein:
an ion metal is introduced in a matrix material in the resistance change film,
a concentration of the ion metal in a first region on the first electrode side of the resistance change film is higher than a concentration of the ion metal in a second region on the second electrode side of the resistance change film, and
the memory device does not include a layer which supplies the resistance change film with ions.

2. The device according to claim 1, wherein:
the first region is a region extending at a distance of two thirds or less of a film thickness of the resistance change film from a surface on the first electrode side of the resistance change film, and
the second region is a region extending at a distance of one third or less of a film thickness of the resistance change film from a surface on the second electrode side of the resistance change film.

3. The device according to claim 1, wherein a resistivity of the second region is $8 \times 10^4$ ($\Omega \cdot m$) or more.

4. The device according to claim 1, wherein:
the matrix material is amorphous silicon,
the ion metal is silver, and
a concentration of the ion metal in the second region is $1 \times 10^{21}$ (atoms/cm$^3$) or less.

5. The device according to claim 4, wherein a concentration of the ion metal in the first region is not less than $1 \times 10^{18}$ (atoms/cm$^3$) and not more than $2 \times 10^{22}$ (atoms/cm$^3$).

6. The device according to claim 1, wherein the resistance change film comprises a multilayer film in which a plurality of layers are stacked, the plurality of layers having different matrix materials from one another.

7. The device according to claim 6, wherein the resistance change film includes:
a first layer disposed on the first electrode side, the matrix material of the first layer being amorphous silicon or polysilicon; and
a second layer disposed on the second electrode side, the matrix material of the second layer being silicon oxide, silicon nitride, or silicon oxynitride.

8. The device according to claim 6, wherein the resistance change film includes:
a first layer disposed on the first electrode side, the matrix material of the first layer being silicon oxide, silicon nitride, or silicon oxynitride; and
a second layer disposed on the second electrode side, the matrix material of the second layer being amorphous silicon or polysilicon.

9. The device according to claim 1, wherein a film thickness of the resistance change film is not less than 1 nm and not more than 100 nm.

10. The device according to claim 1, wherein:
a voltage using the first electrode as a positive pole and the second electrode as a negative pole is applied to form a metal filament in the second region when the resistance change film transitions from a high resistance state to a low resistance state, and
a voltage using the first electrode as a negative pole and the second electrode as a positive pole is applied to eliminate at least part of the metal filament when the resistance change film transitions from a low resistance state to a high resistance state.

11. The device according to claim 1, wherein the matrix material is one or more materials selected from the group consisting of silicon, silicon oxide, silicon nitride, silicon oxynitride, silicon sulfide, silicon chloride, hafnium oxide, hafnium nitride, a hafnium silicate compound, zirconium oxide, zirconium nitride, a zirconium silicate compound, aluminum oxide, aluminum nitride, an aluminum silicate compound, titanium oxide, titanium nitride, and a titanium silicate compound.

12. The device according to claim 1, wherein the ion metal is one more metals selected from the group consisting of gold, silver, copper, platinum, palladium, titanium, iron, chromium, cobalt, nickel, aluminum, indium, tellurium, sodium, and calcium.

13. A memory device comprising:
a first electrode;
a second electrode; and
a resistance change film connected between the first electrode and the second electrode and having a film thickness of not less than 1 nm and not more than 100 nm,
wherein:
silver is introduced in amorphous silicon in the resistance change film,
a concentration of silver in a first region is higher than a concentration of silver in a second region, the first region extending at a distance of two thirds or less of a film thickness of the resistance change film from a surface on the first electrode side of the resistance change film, and the second region extending at a distance of one third or less of a film thickness of the resistance change film from a surface on the second electrode side of the resistance change film,
the concentration of silver in the first region is not less than $1 \times 10^{18}$ (atoms/cm$^3$) and not more than $2 \times 10^{22}$ (atoms/cm$^3$),
the concentration of silver in the second region is $1 \times 10^{21}$ (atoms/cm$^3$) or less,
a resistivity of the second region is $8 \times 10^4$ ($\Omega \cdot m$) or more,
a voltage using the first electrode as a positive pole and the second electrode as a negative pole is applied to form a metal filament in the second region when the resistance change film transitions from a high resistance state to a low resistance state,
a voltage using the first electrode as a negative pole and the second electrode as a positive pole is applied to eliminate at least part of the metal filament when the resistance change film transitions from a low resistance state to a high resistance state, and a layer made of only silver is not provided in the memory device.

* * * * *